United States Patent
Kamenoue et al.

(10) Patent No.: US 11,984,716 B2
(45) Date of Patent: May 14, 2024

(54) POWER CABLE EMBEDDED FLOOR PANEL

(71) Applicant: INTERNATIONAL BUSINESS MACHINES CORPORATION, Armonk, NY (US)

(72) Inventors: Tsuyoshi Kamenoue, Adachi-ku (JP); Hiroyuki Tanaka, Ota-ku (JP); Yutaka Kawai, Suginami (JP)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 17/304,115

(22) Filed: Jun. 15, 2021

(65) Prior Publication Data
US 2022/0399706 A1    Dec. 15, 2022

(51) Int. Cl.
*H02G 3/38*    (2006.01)
*E04F 15/024*    (2006.01)
(Continued)

(52) U.S. Cl.
CPC ....... *H02G 3/285* (2013.01); *E04F 15/02452* (2013.01); *H01R 9/0503* (2013.01);
(Continued)

(58) Field of Classification Search
CPC ......... E04F 15/02417; E04F 15/02451; H02G 3/285
See application file for complete search history.

(56) References Cited

U.S. PATENT DOCUMENTS 4,593,499 A * 6/1986 Kobayashi .......... E04F 15/0247
52/126.6
4,736,555 A * 4/1988 Nagare ............. E04F 15/02494
248/561
(Continued)

FOREIGN PATENT DOCUMENTS

CN   110499859 A   11/2019
FR   2984379 A1 *  6/2013 ............. E01C 5/001
(Continued)

OTHER PUBLICATIONS

IBM, "Raised floors", https://www.ibm.com/support/knowledgecenter/POWER8/p8ebe/p8ebe_raisedfloors.htm, printed Mar. 1, 2021, pp. 1-4.
(Continued)

*Primary Examiner* — Christine T Cajilig
(74) *Attorney, Agent, or Firm* — L. Jeffrey Kelly

(57) ABSTRACT

A floor system in a server room includes a main panel and a sub-panel. The main panel includes main panel inlaid cables and main panel connectors where the main panel inlaid cables connect a first set of the main panel connectors to a second set of the main panel connectors. The sub-panel includes sub-panel inlaid cables and sub-panel connectors where the sub-panel inlaid cables connect the sub-panel connectors to one another. The floor system provides an operating floor via the main panel and the sub-panel where the operating floor is raised relative to a sub-floor and the main panel is a removable floor panel to access a space between the operating floor and the sub-floor. The main (Continued)

panel inlaid cables and the sub-panel inlaid cables establish a current pathway from a power source.

14 Claims, 6 Drawing Sheets

(51) Int. Cl.
   *H01R 9/05* (2006.01)
   *H02G 3/08* (2006.01)
   *H05K 7/14* (2006.01)

(52) U.S. Cl.
   CPC ........... *H02G 3/083* (2013.01); *H05K 7/1491* (2013.01); *H05K 7/1492* (2013.01)

(56) References Cited

U.S. PATENT DOCUMENTS

| | | | |
|---|---|---|---|
| 4,780,571 A * | 10/1988 | Huang | ............... E04F 15/02476 52/220.1 |
| 5,049,700 A * | 9/1991 | Kobayashi | ............. H02G 3/185 52/263 |
| RE41,863 E | 10/2010 | Sempliner | |
| 8,590,219 B2 | 11/2013 | Meyer | |
| 9,088,145 B2 | 7/2015 | Brooks | |
| 9,394,700 B1 | 7/2016 | Rodriguez | |
| 2011/0016809 A1* | 1/2011 | Knight, III | ........ E04F 15/02452 52/263 |
| 2017/0009461 A1 | 1/2017 | Rodriguez | |
| 2018/0195293 A1* | 7/2018 | Marchetti | ......... E04F 15/02405 |
| 2021/0036445 A1 | 2/2021 | Yamamoto | |

FOREIGN PATENT DOCUMENTS

| | | | | |
|---|---|---|---|---|
| JP | H0847117 A | 2/1996 | | |
| JP | 2005016161 A | 1/2005 | | |
| JP | 2012077573 A | 4/2012 | | |
| WO | WO-2010049770 A2 * | 5/2010 | ........ | E04F 15/02417 |
| WO | 2022263990 A1 | 12/2022 | | |

OTHER PUBLICATIONS

Kyodo Ky-Tec Corp., "Network Floor 40/29", https://www.ky-tec.co.jp/english/oa/lineup/, pp. 1-3.

International Search Report and Written Opinion, International application No. PCT/IB2022/055435, International filing date Jun. 13, 2022, Date of mailing Aug. 25, 2022, 7 pages.

* cited by examiner

POWER CABLE EMBEDDED FLOOR PANEL

BACKGROUND

The exemplary embodiments relate generally to a floor panel system, and more particularly to floor panels used in a server room that includes server racks configured to provide power to server units housed in the server racks.

A server room may house a plurality of different network equipment. Each piece of network equipment may provide respective functionalities. In providing these functionalities, the network equipment may require one or more different types of cables or physical connections. The network equipment may further require power. Accordingly, each network equipment may utilize one or more cables to accommodate the power requirement and provide the appropriate functionality (e.g., a power cable to receive power, an ethernet cable for a type of data exchange, fibre channel cable for another type of data exchange, etc.). To improve organization, particularly as the number of network equipment increases along with the cable requirements, the server room may utilize a server rack that houses one or more network equipment and provides one or more mechanisms to allow for the connections to be organized, at least for the network equipment housed therein. For example, the server rack may include outlets within the housing such that each network equipment housed in the server rack may establish a power connection. The server rack may include a power cable that connects to a power source such that any network equipment utilizing an outlet in the server rack may be provided power. In another example, the server rack may include cable combs, recesses, gutters, etc. that allow for the various cables to be placed in the server rack such that the cables are placed in an organized manner and not strewn about randomly.

The server room may also be configured to allow for the server racks to be positioned in a variety of manners. The server racks and the network equipment housed therein may be reconfigured or reorganized as desired based on needs at a given time. In allowing for this capability, the server room may include various features that allow for the ad hoc reorganization and reconfiguration of the server room. For example, the various features may accommodate the reorganization/reconfiguration of the server racks, the network equipment housed therein, and the various types of cables involved in utilizing the server racks and network equipment (e.g., power cables, data cables, etc.).

A conventional approach may include a feature where the floor is a raised floor comprising removable floor panels positioned atop a sub-floor frame. In this conventional approach, the floor of the server room may be a free access floor. The sub-floor frame may create a space between the removable floor panels and a sub-floor in which the cables may be threaded and stored. In this manner, the cables are not required to be laid across a walking surface or a surface on which the network equipment may be placed of the server room (e.g., a surface on which the server racks are placed, where people may travel, etc.). However, after long-term operation, the layers of each cable may pile up randomly where the wiring may become unmanageable. Additionally, among the various types of cables, power cables have a relatively large diameter yet require sufficient length to meet the demand for the server rack to be installed at any location within the server room. Thus, the power cables are provided with an increased amount of length and placed under the floor panels in a coiled orientation such that the power cable may be extracted (e.g., uncoiled) or retracted (e.g., re-coiled) as necessary. The storage of the additional power cable as well as other cables under the floor panels may also prevent airflow as cold air is circulated throughout the server room. Those skilled in the art will appreciate the need for proper air circulation to maintain a proper operating temperature of the network equipment (e.g., prevent overheating).

To resolve at least one of the above noted issues with removable floor panels in a free access floor of a server room, a conventional approach may install the cables in a duct attached to the ceiling. The ceiling approach may include a frame extending from the ceiling from which the cables may be installed. The server rack may be positioned below an appropriate location of the frame where the cables are available. However, in using this conventional approach, the server racks are only capable of being positioned along a path of the duct where the cables would become available. That is, a position of the server racks is dictated by the ceiling configuration. Any subsequent change in the position of the server rack, particularly when apart from the ducts, may require a ceiling renovation of the ceiling approach such that the cables are available at a desired position of the server rack.

In another conventional approach that attempts to resolve the issue of cables being strewn in the free access floor, groove wiring type or laying type floor panels may be used. The groove wiring type or laying type floor panels include a groove carved in advance therein such that the cable may be laid on the floor panel. In this manner, the cables may be laid adjacent the floor panel and not rest on the sub-floor and may maximize a space under the floor (e.g., the space between the removable floor panels and the sub-floor). However, the groove wiring type or laying type floor panels in this conventional approach are fixed and cannot be removed, thereby replacing one feature (e.g., free access flooring with removable floor panels) with another feature (e.g., inlaid cables on the floor panel). Further conventional approaches utilize cable through floor panels in some form such as in U.S. Pat. Nos. 9,394,700 and 5,049,700 but ultimately prevent any removal of the floor panels once the cables have been laid therethrough.

As network operations progress, different network solutions may be instituted. For example, a data center may move operations from a local network and server room to a cloud infrastructure. With particular emphasis to cloud implementations, the server racks that are used in the cloud implementation may require addition, subtraction, movement, etc. of server racks to meet the various demands of resources by end users utilizing the cloud. Accordingly, a feature of enabling adjustable environments for cabling may allow for such needs of server rack positioning and configuration. In addition, flexible maintenance under the floor panels may be required to accommodate this feature. Therefore, removable floor panels may be preferable over fixed floor panels with inlaid cable. Accordingly, there is a need to retain the benefits of free access flooring utilizing removable floor panels as well as the benefits of further solutions utilizing inlaid cables while overcoming the drawbacks in respective solutions of conventional approaches.

SUMMARY

The exemplary embodiments disclose a system and a method for a floor system in a server room. The floor system comprises a main panel and a sub-panel. The main panel includes main panel inlaid cables and main panel connectors where the main panel inlaid cables connect a first set of the main panel connectors to a second set of the main panel connectors. The sub-panel includes sub-panel inlaid cables and sub-panel connectors where the sub-panel inlaid cables connect the sub-panel connectors to one another. The floor system provides an operating floor via the main panel and the sub-panel where the operating floor is raised relative to a sub-floor and the main panel is a removable floor panel to access a space between the operating floor and the sub-floor. The main panel inlaid cables and the sub-panel inlaid cables establish a current pathway from a power source.

In a preferred embodiment, the sub-panel further includes a sub-panel outlet configured to receive a plug from a server rack located in the server room, the sub-panel outlet powering the server rack via the current pathway.

In a preferred embodiment, the main panel connectors are disposed on an underside of the main panel.

In a preferred embodiment, the main panel connectors are plugs extending downward from the underside of the main panel.

In a preferred embodiment, the main panel connectors are located at a corner of the main panel.

In a preferred embodiment, the sub-panel connectors are sockets extending upward toward a top surface of the sub-panel where the sockets are configured to receive the plugs.

In a preferred embodiment, the main panel and the sub-panel are formed into a point symmetrical shape when viewed from a respective center point.

In a preferred embodiment, the main panel and the sub-panel create a flush surface of the operating floor.

In a preferred embodiment, the main panel inlaid cables, the main panel connectors, the sub-panel inlaid cables, and the sub-panel connectors are configured for a three-phase 200V current.

In a preferred embodiment, the power source is a distribution board of the server room.

The exemplary embodiments disclose a server room floor system comprising a sub-floor frame and a floor system. The sub-floor frame is positioned on a sub-floor where the sub-floor is beneath an operating floor of the floor system. The sub-floor frame includes posts for the operating floor to be raised a distance from the sub-floor. The floor system for the operating floor comprising a main panel and a sub-panel, the main panel including main panel inlaid cables and main panel connectors, the main panel inlaid cables connecting a first set of the main panel connectors to a second set of the main panel connectors, the sub-panel including sub-panel inlaid cables and sub-panel connectors, the sub-panel inlaid cables connecting the sub-panel connectors to one another. The main panel is a removable floor panel to access a space between the operating floor and the sub-floor. The main panel inlaid cables and the sub-panel inlaid cables establish a current pathway from a power source.

In a preferred embodiment, the sub-panels are fixedly attached to a raised end of the posts of the sub-floor frame.

In a preferred embodiment, the sub-floor frame defines locations on which the main panel is configured to be installed.

In a preferred embodiment, the main panel and the sub-panel are formed into a point symmetrical shape when viewed from a respective center point.

The exemplary embodiments disclose a main panel of a floor system in a server room comprising a tile, first and second main panel connectors, and main panel inlaid cables. The tile provides a surface of an operating floor of the floor system. The first and second main panel connectors are located at respective corners of the tile where the first and second main panel connectors are configured to couple to a sub-panel connector of a sub-panel. The main panel inlaid cables connect the first and second main panel connectors to each other. The main panel inlaid cables are configured to establish a current pathway from a power source with sub-panel inlaid cables of the sub-panel as a result of one of the first and second main panel connectors coupling to the sub-panel connector. The main panel is a removable floor panel.

The exemplary embodiments disclose a sub-panel of a floor system in a server room comprising a sub-panel top surface, a plurality of sub-panel connectors, and sub-panel inlaid cables. The sub-panel top surface provides a surface of an operating floor of the floor system. The plurality of sub-panel connectors is configured to couple to a main panel connector of a removable main panel. The sub-panel inlaid cables connect the sub-panel connectors to one another. The sub-panel inlaid cables are configured to establish a current pathway from a power source with main panel inlaid cables of the main panel as a result of one of the sub-panel connectors coupling to the main panel connector.

BRIEF DESCRIPTION OF THE SEVERAL VIEWS OF THE DRAWINGS

The following detailed description, given by way of example and not intended to limit the exemplary embodiments solely thereto, will best be appreciated in conjunction with the accompanying drawings, in which.

Figure 1:
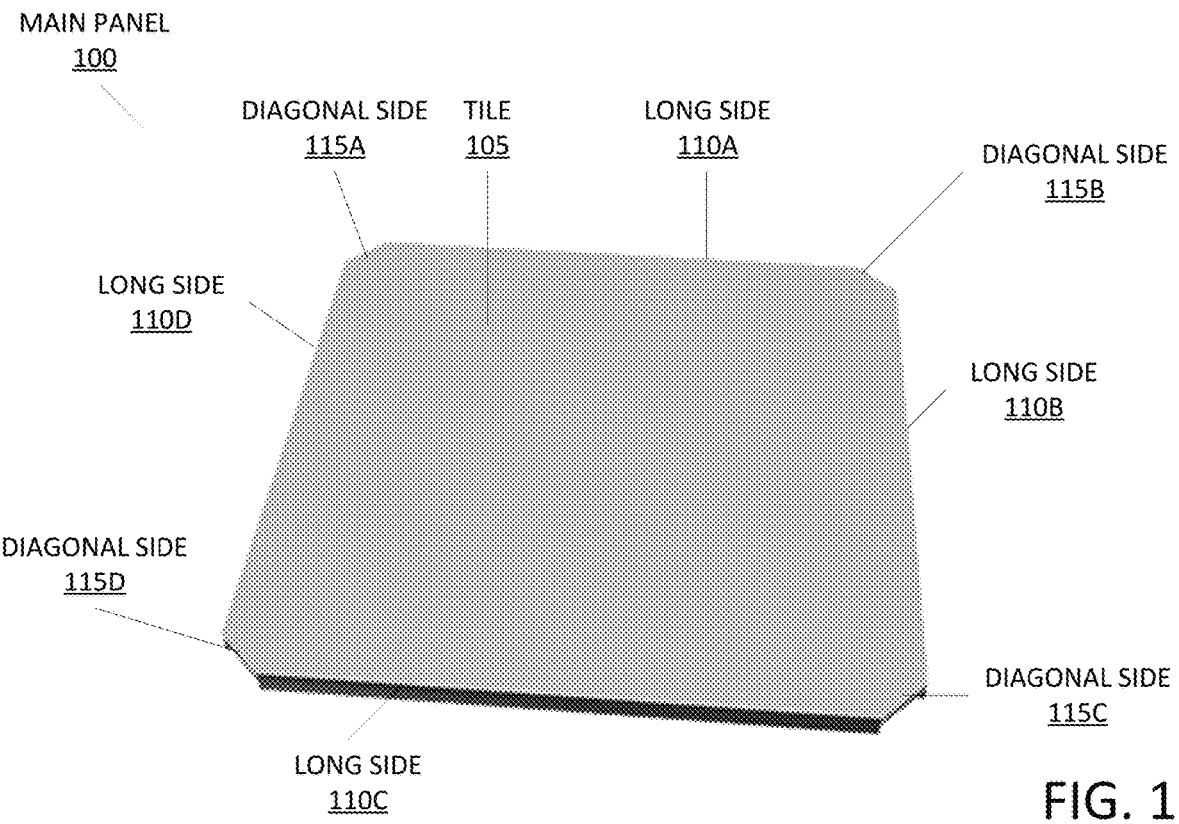
FIG. 1 depicts a top side of an exemplary main panel 100, in accordance with the exemplary embodiments.

The drawings are not necessarily to scale. The drawings are merely schematic representations, not intended to portray specific parameters of the exemplary embodiments. The drawings are intended to depict only typical exemplary embodiments. In the drawings, like numbering represents like elements.

DETAILED DESCRIPTION OF THE SEVERAL VIEWS OF THE DRAWINGS

Detailed embodiments of the claimed structures and methods are disclosed herein; however, it can be understood that the disclosed embodiments are merely illustrative of the claimed structures and methods that may be embodied in various forms. The exemplary embodiments are only illustrative and may, however, be embodied in many different forms and should not be construed as limited to the exemplary embodiments set forth herein. Rather, these exemplary embodiments are provided so that this disclosure will be thorough and complete, and will fully convey the scope to be covered by the exemplary embodiments to those skilled in the art. In the description, details of well-known features and techniques may be omitted to avoid unnecessarily obscuring the presented embodiments.

References in the specification to "one embodiment", "an embodiment", "an exemplary embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

In the interest of not obscuring the presentation of the exemplary embodiments, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements according to the various exemplary embodiments.

The exemplary embodiments are directed to a floor system for a server room and a method for installing the floor system. The floor system may provide a free access floor including a raised floor over a sub-floor where the raised floor is supported by a sub-floor frame. The raised floor (hereinafter referred to as "floor") of the floor system of the exemplary embodiments may include a plurality of main panels and sub-panels. The main panels may provide a majority of the area of a surface of the floor. The main panels may include inlaid power cables configured to allow power to flow through the main panels. The sub-panels may be configured to electrically connect to the main panels such that the power may be provided to the sub-panel. The sub-panels may include an outlet for which a plug may be inserted, thereby providing power to the unit to which the plug belongs. As a free access floor, the main panels may be removable floor panels. Key benefits of the exemplary embodiments may include the benefits associated with free access floors utilizing removable floor panels and the benefits of panels utilizing inlaid cables without the drawbacks associated with either. Detailed implementation of the exemplary embodiments follows.

The exemplary embodiments utilize terms designated with relative descriptors. For example, the floor system comprises main panels and sub-panels. The "main" and "sub" aspect of these terms are not indicative of importance, position, orientation, etc. The descriptors are merely utilized to differentiate between the types of panels that are being utilized in the floor system of the exemplary embodiments. As will become apparent from the description below, according to an exemplary embodiment, the main panel and the sub-panel may be positioned in a way such that a portion of the sub-panel is placed under a portion of the main panel. In another example, the floor system comprises a sub-floor and a raised floor. The "sub" and "raised" aspect of these terms are not indicative of position relative to a floor, for example, in an adjacent room. Rather, the sub-floor and the raised floor are indicative of a relative position with respect to each other in an area in which the floor according to the exemplary embodiments is assembled. Those skilled in the art will recognize the various implementations of a free access floor having a raised floor with regard to a floor in an adjacent room to the server room.

The exemplary embodiments are described with regard to a server room. However, the exemplary embodiments being directed toward the server room is only for illustrative purposes. The floor system according to the exemplary embodiments may be utilized and/or modified for any area in which a free access floor may be utilized where a unit that requires power may be positioned anywhere in that area. Furthermore, the description below relates to providing power or current. The terms "power" and "current" will be utilized interchangeably with regard to powering an electronic unit.

FIG. 1 depicts a top side of an exemplary main panel 100, in accordance with the exemplary embodiments. The main panel 100 may be a removable floor panel in a free access floor of a server room. The floor system according to the exemplary embodiments may be a raised floor in which a sub-floor is present underneath a surface of the floor system. As will be apparent in view of the description herein, the main panel 100 may comprise a substantial amount of the surface area of a top side of the floor system (e.g., a walking area of the floor). In a raised floor configuration, the main panel 100 may be placed on a sub-floor frame that will be described in further detail below. As illustrated in FIG. 1, the main panel 100 may include a tile 105, long sides 110A-D, and diagonal sides 115A-D.

The tile 105 may be a substantially planar or flat surface. The tile 105 may be manufactured with a sufficient strength to hold a predetermined amount of weight. The predetermined amount of weight may be based on a maximum weight expected to be placed atop the main panel 100 (e.g., a fully filled server rack with a person working on the server rack). The predetermined amount of weight may include an additional amount to the expected maximum weight to compensate for unexpected circumstances (e.g., a safety margin). The tile 105 may also be manufactured or covered with a material that enables the main panel 100 to be removed. For example, the planar surface of the tile 105 may allow for a suction device to pull the main panel 100 from a resting position in the floor system. In this manner, the main panel 100 may retain a functionality of covering a portion of an area of the floor without impairing a removable functionality in each panel unit for underfloor maintenance.

According to an exemplary embodiment, the main panel 100 may exhibit a substantially octagonal shape in which one of the diagonal sides 115A-D is positioned between adjacent ones of the long sides 110A-D. For example, the diagonal side 115B is positioned between long sides 110A and 110B. As will be described in further detail below, the octagonal shape of the main panel 100 may provide a configuration in which a sub-panel may be properly positioned.

According to an exemplary embodiment, the main panel 100 may be substantially square in appearance where the long sides 110A-D have a length that is substantially greater than a length of the diagonal sides 115A-D. Accordingly, the long sides 110A-D may each have a same length while the diagonal sides 115A-D may each have a same, lesser length. For example, the long sides 110A-D may be or approximately be 60 cm (e.g., may extend 60 cm along its actual length or may extend along a length as if the main panel 100 was a square such as without the diagonal sides 115A-D) and the diagonal sides 115A-D may be or approximately be 8 cm.

Figure 2:
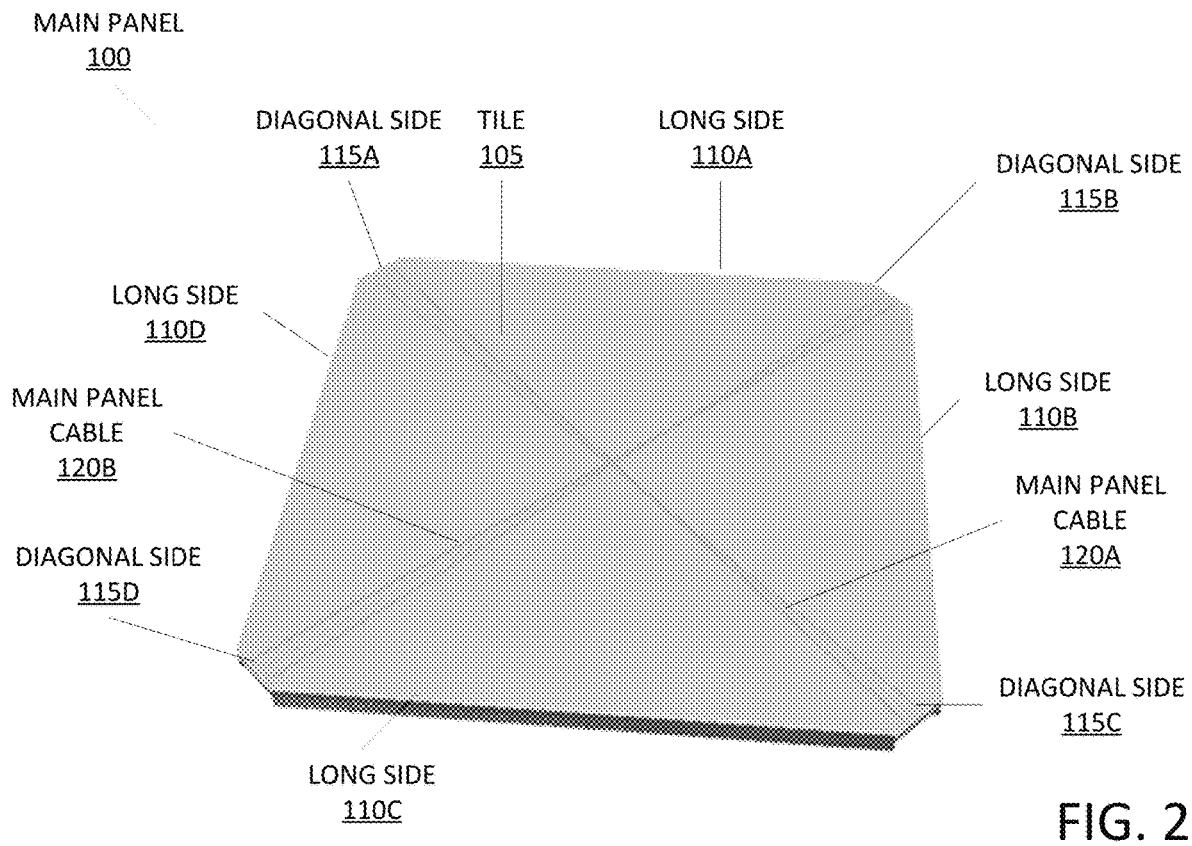
FIG. 2 depicts the top side of the exemplary main panel 100 of FIG. 1 shown with a transparency, in accordance with the exemplary embodiments.

FIG. 2 depicts the top side of the exemplary main panel 100 of FIG. 1 shown with a transparency, in accordance with the exemplary embodiments. The tile 105 may be provided with at least a semi-transparency or may be provided as opaque. For example, if at least semi-transparent, the space between the sub-floor and the floor of the floor system may be visible without removal of the main panels 100. In this manner, maintenance may be performed more efficiently. For illustrative purposes, the exemplary embodiments may be directed toward the tiles 105 of the main panels 100 being opaque and the transparency is to illustrate further components of the main panel 100.

The main panel 100 may further include main panel cables 120A, 120B. The main panel cables 120A, 120B may be inlaid in the main panel 100. For example, the main panel cables 120A, 120B may be adjacent an underside of the tile 105. In another example, the main panel cables 120A, 120B may extend through the tile 105. The main panel cables 120A, 120B may extend from one of the diagonal sides 115A-D to an opposite one of the diagonal sides 115A-D. For example, as illustrated, the main panel cables 120A may extend from diagonal side 115A to diagonal side 115C while the main panel cables 120B may extend from diagonal side 115B to diagonal side 115D. The main panel cables 120A, 120B may each include a plurality of cables. For example, depending on the type of power to be conducted therethrough (e.g., as defined by the power inlet/outlet), each of the main panel cables 120A, 120B may include three cables to handle providing power using a three-phase 200V current. The main panel cables 120A, 120B extending diagonally through the main panel 100 is only exemplary. According to another exemplary embodiment, there may be four sets of main panel cables substantially similar to the main panel cables 120A, 120B that extend longitudinally (e.g., along horizontal sides such as from diagonal side 115A to diagonal side 115B as viewed in FIG. 1) and laterally (e.g., along vertical sides such as from diagonal side 115B to diagonal side 115C as viewed in FIG. 1). According to a further exemplary embodiment, there may be six sets of main panel cables substantially similar to the main panel cables 120A, 120B that combines the diagonally, laterally, and longitudinally disposed main panel cables. As will be described in further detail below, the main panel cables 120A, 120B may enable power to flow from a distribution board to a desired location where a server rack may be positioned on the floor system of the exemplary embodiments. To ensure that this power flow is achieved, the main panels 100 that are installed may incorporate the appropriate type of main panel cables 120A, 120B with regard to configuration through the main panel 100. For example, for main panels 100 that are in a non-end area of the floor system may utilize the diagonal, lateral, and/or longitudinal configuration of the main panel cables 120A, 120B. In another example, main panels 100 that are in an end area of the floor system may utilize lateral and/or longitudinal configuration of the main panel cables 120A, 120B, particularly if the main panels 100 require resizing (e.g., cutting a portion) for proper placement.

Figure 3:
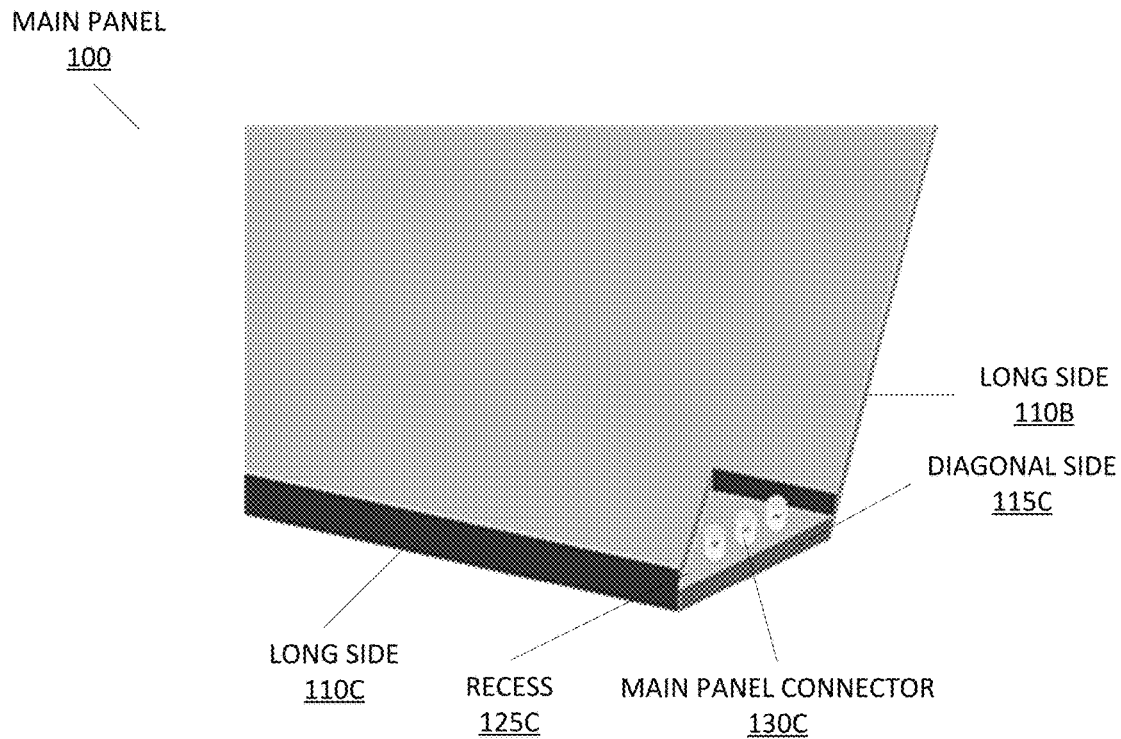
FIG. 3 depicts a bottom portion of the exemplary main panel 100 of FIG. 1, in accordance with the exemplary embodiments.

FIG. 3 depicts a bottom portion of the exemplary main panel 100 of FIG. 1, in accordance with the exemplary embodiments. For example, the bottom portion of the main panel 100 may be an underside of an area adjacent one of the diagonal sides 115A-D in a substantial "corner" position. As illustrated in FIG. 3, the selected one may be the diagonal side 115C. As described above and as illustrated in FIG. 3, the diagonal side 115C may be disposed between long sides 110B, 110C. As illustrated, the main panel 100 may further include a recess 125C and a main panel connector 130C. It is noted that any use of the term "corner" with regard to the bottom portion in this instance and utilized herein is in reference to the exemplary main panel 100 being viewed as a substantial square (e.g., the long sides 110A-D extend further to intersect with an adjacent one of the long sides 110A-D) and any reference to a "corner" relates to the general area as if the area is occupied by the main panel 100 when having a square shape rather than the octagonal shape.

The recess 125C may extend from the diagonal side 115C toward a center of the main panel 100. According to an exemplary embodiment, the recess 125C may be a 90° corner cutout. The size and shape of the recess 125C may be selected such that a portion of the sub-panel may be positioned in the recess 125C. As will be described in further detail below, the recess 125C and the portion of the sub-panel may both be formed into a point symmetrical shape when viewed from the panel center point of the main panel 100. The point symmetrical shape may prevent occurrences of problems including a current cut-off and a short-circuit even as a result of the main panel 100 and the sub-panel being fitted with wrong directions (0°, 90°, 180°, and 270°).

The main panel connector 130C may be an end point of one of the main panel cables 120A, 120B. An opposite end of the one of the main panel cables 120A, 120B may be a further main panel connector (e.g., located at an opposing corner of the main panel 100 such as at the diagonal side 115A). In this manner, the main panel cables 120A, 120B may connect opposing main panel connectors of the main panel 100. As will be described in further detail below, the main panel connector 130C may establish an electrical connection with a corresponding connector on the sub-panel such that power may be conducted through the main panel 100 and the sub-panel. The main panel connector 130C may be configured in a variety of shapes and sizes and may also utilize any electrical connection mechanism. For example and as illustrated in FIG. 3 according to an exemplary embodiment, the main panel connector 130C may be a plug pointed downward from a surface of the recess 125C. The plug may be configured as a three prong plug. In the exemplary embodiment of the three-phase 200V current, each prong of the plug may accommodate a respective wire of the corresponding one of the main panel cables 120A, 120B. The plug may extend a length that does not exceed a depth of the recess 125C. However, it is noted that the length of the plug may be based on the type of connection being established such that the length may span a range that may or may not exceed the depth of the recess 125C. In another example, the main panel connector 130C may utilize conductive and/or magnetic technology for power transfer. The exemplary embodiments may be modified to incorporate any power transfer mechanism that may be utilized in the main panel 100 and the sub-panel.

The bottom portion of the exemplary main panel 100 illustrated in FIG. 3 with regard to the area adjacent the diagonal side 115C may also represent the bottom side of the other three corners in the exemplary main panel 100 (e.g., the areas adjacent the diagonal sides 115A, 115B, and 115C). Accordingly, each of the corners of the main panel 100 adjacent the diagonal sides 115A-D may include a corresponding recess (not shown on the bottom side perspective) that is substantially similar to the recess 125C.

Figure 4:
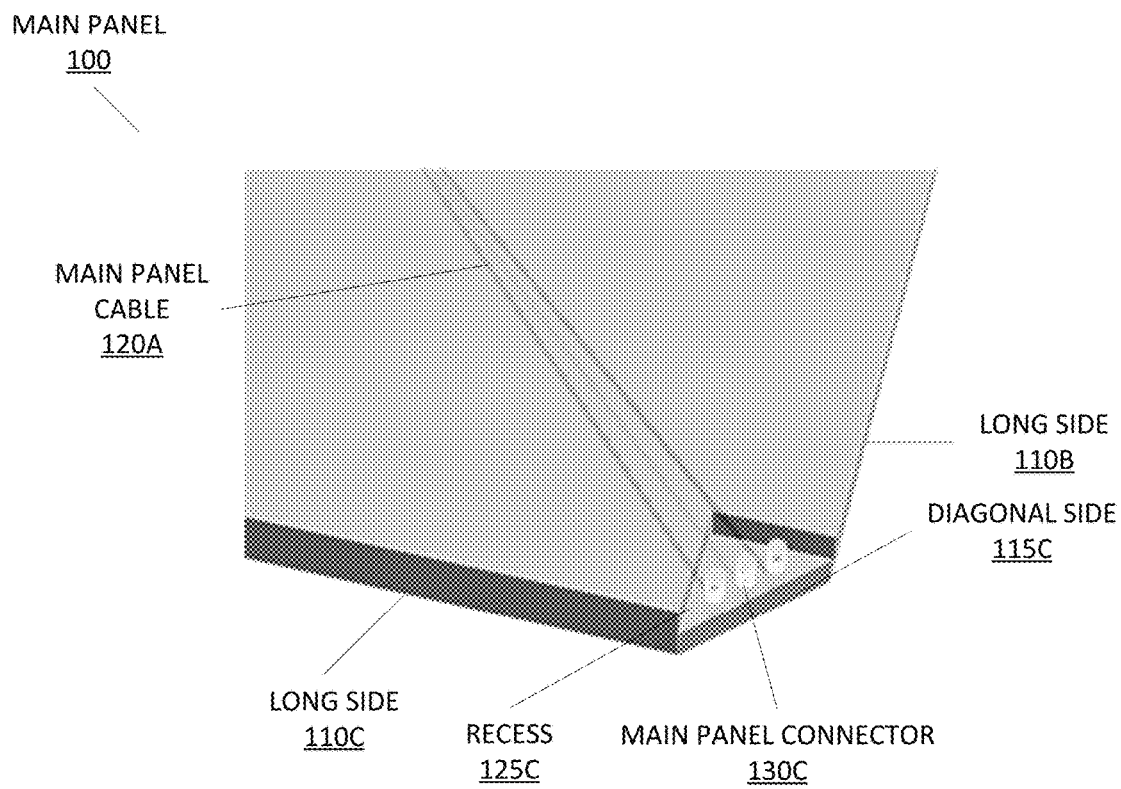
FIG. 4 depicts the bottom portion of the exemplary main panel 100 of FIG. 3 shown with a transparency, in accordance with the exemplary embodiments.

FIG. 4 depicts the bottom portion of the exemplary main panel 100 of FIG. 3 shown with a transparency, in accordance with the exemplary embodiments. Continuing with the exemplary embodiment in which the tile 105 of the main panel 100 is opaque and the transparency is to illustrate further components of the main panel 100, the main panel cables 120A are visible. As described above, the main panel cables 120A may extend from the diagonal side 115A to the diagonal side 115C. One end of the main panel cables 120A may terminate at the main panel connector 130C. The other end of the main panel cables 120A may terminate at a further main panel connector (not shown) that is substantially similar to the main panel connector 130C in a recess that is substantially similar to the recess 125C in an area adjacent the diagonal side 115A. In the exemplary embodiment directed toward the three-phase 200V current and as illustrated in FIGS. 2 and 4, the three cables of the main panel cables 120A, 120B may include a twist such that each of the cables of the main panel cables 120A, 120B terminate at a corresponding one of the prongs in the main panel connector such as the main panel connector 130C.

Figure 5:
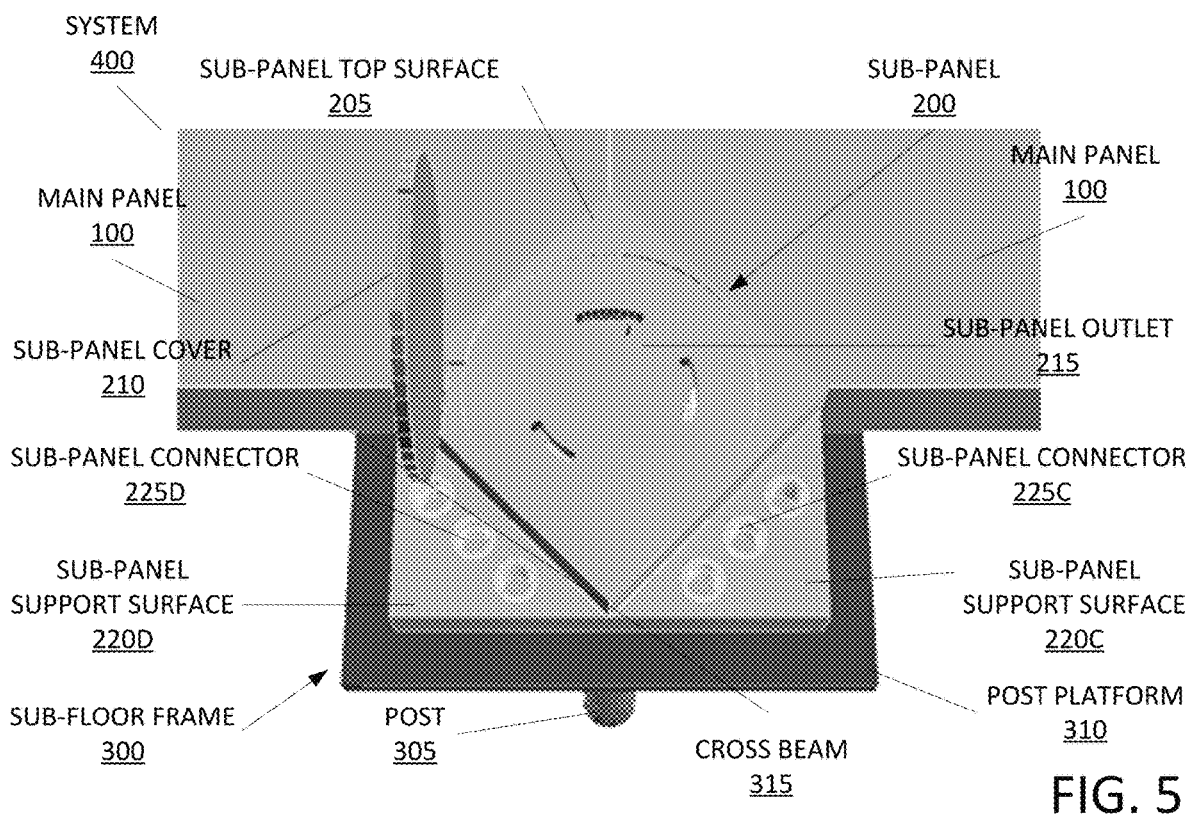
FIG. 5 depicts an exemplary floor system 400 including the exemplary main panel 100, a sub-panel 200, and a sub-floor frame 300, in accordance with the exemplary embodiments.

FIG. 5 depicts an exemplary floor system 400 including the exemplary main panel 100, a sub-panel 200, and a sub-floor frame 300, in accordance with the exemplary embodiments. The exemplary floor system 400 illustrated in FIG. 5 is a view of when two adjacent main panels 100 are positioned next to one another atop the sub-floor frame 300. Accordingly, the long side 110B, the long side 110C, and the diagonal side 115C of a first one of the main panels 100 (e.g., the main panel 100 on the left side of FIG. 5) as well as the long side 110C, the long side 110D, and the diagonal side 115D of a second one of the main panels 100 (e.g., the main panel on the right side of FIG. 5) are visible. In the exemplary floor system 400 of FIG. 5, the long side 110B of the first one of the main panels 100 may be adjacent the long side 110D of the second one of the main panels 100. As will be described in use cases below, the main panels 100 may be arranged on the sub-floor frame 300 in a substantial grid or checker pattern as well as in an aligned manner (e.g., as opposed to a stagger pattern from one row to another) where the long sides 110A-D of adjacent ones of the main panels 100 are aligned along their lengths (e.g., ends of a long side 110A of a first one of the main panels 100 correspond to ends of a long side 110C of a second one of the main panels 100).

The sub-panel 200 may be a further component of the floor system 400 that is used in combination with the main panel 100. In an exemplary functionality, the sub-panel 200 may allow for power to conduct from a first main panel 100 to a second main panel 100 that is adjacent (e.g., the second main panel 100 having a long side 110A-D where a length thereof is along a length of a corresponding long side 110A-D of the first main panel 100) and/or diagonally disposed (e.g., the second main panel 100 having a diagonal side 115A-D where a length thereof faces a length of a corresponding diagonal side 115A-D of the first main panel 100). Thus, for a given main panel 100, any further main panel 100 that is adjacently or diagonally disposed may have power conducting therethrough via the sub-panel 200 shared between the main panel 100 and the further main panel 100. In another exemplary functionality, the sub-panel 200 may provide an outlet in which a power plug may be inserted. For example, a server rack may include the power plug and may plug into the outlet of the sub-panel 200. Thus, network equipment housed in the server rack may be provided power via the server rack, such as when the server rack includes a power distribution unit (PDU). As illustrated in FIG. 5 and according to the exemplary embodiments, the sub-panel 200 may include a sub-panel top surface 205, a sub-panel cover 210, a sub-panel outlet 215, sub-panel support surfaces 220A-D, and sub-panel connectors 225A-D.

The sub-panel top surface 205 may be a top side of the sub-panel 200 akin to the tile 105 of the main panel 100. The sub-panel top surface 205 may be configured such that a surface thereof may be flush with the tile 105 of each main panel 100 adjacent to the sub-panel 200. The sub-panel top surface 205 may exhibit a shape (e.g., when viewed from above) that corresponds to when a plurality of main panels 100 are positioned adjacently and diagonally to one another. For example, according to the exemplary embodiments, the main panels 100 may be configured so that up to four of the main panels 100 may be positioned together. Specifically, a first one of the main panels 100 may be placed such that a second one of the main panels 100 is placed adjacent longitudinally (e.g., the long side 110B of the first main panel 100 is adjacent the long side 110D of the second main panel 100), a third one of the main panels 100 is placed diagonally (e.g., the diagonal side 115C of the first main panel 100 is facing the diagonal side 115A of the third main panel 100 and the long side 110C of the second main panel is adjacent the long side 110A of the third main panel 100), and a fourth one of the main panels 100 is placed adjacent laterally (e.g., the long side 110C of the first main panel 100 is adjacent the long side 110A of the fourth main panel 100, the diagonal side 115D of the second main panel 100 is facing the diagonal side 115B of the fourth main panel 100, and the long side 110D of the second main panel 100 is adjacent the long side 110B of the fourth main panel 100). The resulting shape that is created from this arrangement may coincide with the shape of the sub-panel 200. For example, the main panel 100 may be shaped such that an angle created between one of the long sides 110A-D and an adjacent one of the diagonal sides 115A-D may be 135°. Thus, the supplementary angle of 45° along with an adjacent supplementary angle of 45° may create a right angle. As such, with the same measurements for the diagonal sides 115A-D across the main panels 100 creating the space for the sub-panel 200, the sub-panel top surface 205 may be a square whose lengths correspond to the lengths of the diagonal sides 115A-D. For example, to eliminate any space between the diagonal sides 115A-D and the sub-panel top surface 205 as well as create a flush surface throughout the floor system of the exemplary embodiments, the lengths of the sides of the sub-panel top surface 205 may be equal to the length of the diagonal sides 115A-D. Continuing with the above example in which the diagonal sides 115A-D are each 8 cm, the lengths of the sides of the sub-panel top surface 205 may also be 8 cm. A height of the sub-panel 200 along a length of the sub-panel top surface 205 may correspond to a height of the main panel 100. For example, the height of the sub-panel 200 may be greater than or equal to the height of the main panel 100 while maintaining the flush surface.

The sub-panel top surface 205 may include the sub-panel outlet 215. The sub-panel outlet 215 may be disposed on a section of the sub-panel top surface 205. For example, the sub-panel outlet 215 may be a centralized, circular section of the sub-panel top surface 205 (e.g., the center of the sub-panel outlet 215 may coincide with the center of the sub-panel top surface 205). In this example, the sub-panel outlet 215 may have a diameter that corresponds to the length of the sides of the sub-panel top surface 205 (e.g., same length). The sub-panel outlet 215 may provide any type of outlet and receive a corresponding power plug. Continuing with the above example, the sub-panel outlet 215 may be sized and shaped to correspond to a power plug utilizing a three-phase 200V current.

The sub-panel cover 210 may be configured to hingedly move in opening and covering the sub-panel outlet 215. For example, when the sub-panel outlet 215 is to be used, the sub-panel cover 210 may be rotated away from the sub-panel top surface 205 along a hinge, thereby exposing the sub-panel outlet 215. In another example, when the sub-panel outlet 215 is not being used, the sub-panel cover 210 may be rotated toward the sub-panel top surface 205 along the hinge. The sub-panel cover 210 may be configured to maintain a flush surface when in the closed or covering position. Thus, the portion of the sub-panel top surface 205 that remains exposed, the sub-panel cover 210, and the one or more main panels 100 adjacent the sub-panel 200 may create a flush surface. To accommodate the flush surface, the sub-panel outlet 215 may be recessed on the sub-panel top surface 205. The amount that the sub-panel outlet 215 is recessed in the sub-panel top surface 205 may be greater than or equal to a height of the sub-panel cover 210. In this manner, while in the closed or covering position, an outer side of the sub-panel cover 210 may be flush with the portion of the sub-panel top surface 205 that remains exposed. It is noted that the use of the sub-panel cover 210 is only exemplary. In another exemplary embodiment, the sub-panel 200 may not utilize the sub-panel cover 210. In such an embodiment, the sub-panel outlet 215 may not be recessed and the entire sub-panel top surface 205 may have a uniform surface and remain exposed.

The sub-panel support surfaces 220A-D may be portions of the sub-panel 200 that extend beyond the sides of the sub-panel top surface 205 when viewed from above. As illustrated in FIG. 5 and according to an exemplary embodiment, the sub-panel support surfaces 220A-D may have a substantially isosceles right triangle shape whose right angle is facing the side of the sub-panel top surface 205. That is, the hypotenuse of the sub-panel support surface 220A-D may extend along the length of the sub-panel top surface 205. The sub-panel support surfaces 220A-D may be sized and shaped to be received and fit in corresponding ones of the recesses of the main panel 100 such as the recess 125C. In this manner, the height of the sub-panel support surfaces 220A-D may correspond to a height of the recesses of the main panel 100. For example, the height of the sub-panel support surfaces 220A-D may be greater than or equal to a height of the recesses of the main panel 100. As noted above, the sub-panel 200 through the sub-panel support surfaces 220A-D may allow for the point symmetrical shape. As one skilled in the art will appreciate, the main panel 100 and the sub-panel 200 may utilize this point symmetrical shape to prevent occurrences of problems (e.g., a current cut-off, a short-circuit, etc.) even as a result of the main panel 100 and the sub-panel 200 being fitted with wrong directions (0°, 90°, 180°, and 270°) since these fittings for assembly are permitted.

On each of the sub-panel support surfaces 220A-D, the sub-panel 200 may include the sub-panel connectors 225A-D. The sub-panel connectors 225A-D may correspond to the main panel connectors on the main panel 100 such as the main panel connector 130C. As described above, the main panel connector 130C may establish an electrical connection with one of the sub-panel connectors 225A-D. In this manner, the sub-panel connectors 225A-D may be the corresponding connector for the main panel connector 130. Also as described above, the main panel connector 130C may be configured in a variety of shapes and sizes and may also utilize any electrical connection mechanism such as a plug pointed downward from a surface of the recess 125C. Continuing with this exemplary embodiment, the sub-panel connectors 225A-D may be configured to receive the main panel connector 130C that is shaped as a plug (e.g., a three prong plug). For example, the sub-panel connectors 225A-D may be a socket to receive the plug. To accommodate the plug of the main panel connector 130C, the sub-panel connectors 225A-D may be pointed upward when viewed from above. In this manner, the downward facing plug of the main panel connector 130C may be received in the upward facing socket of the sub-panel connectors 225A-D. It is again noted that the plug/socket configured of the main panel connector 130C and the sub-panel connectors 225A-D is only for illustrative purposes and other types of power transfer mechanisms may be utilized and adapted for use in the exemplary embodiments.

The sub-panel 200 may also include sub-panel cables (not shown) such that power may flow among the sub-panel connectors 225A-D and/or the sub-panel outlet 215. The sub-panel cables may be arranged in a manner substantially similar to the main panel cables 120A, 120B. For example, the sub-panel cables may be arranged diagonally, laterally, and/or longitudinally. The sub-panel cables may also be configured to provide power to the sub-panel outlet 215 based on a relative position of the sub-panel outlet 215 on the sub-panel 200.

The sub-panel 200 may also be configured to safety features, particularly with regard to the sub-panel connectors 225A-D. For example, while the main panels 100 are assembled and in place, the sub-panel connectors 225A-D may establish a connection to the main panel connectors such as the main panel connector 130C. However, as the main panels 100 are removable floor panels, one of the main panels 100 may be removed (e.g., to perform underfloor maintenance in the space between the floor and the sub-floor). When removed, the sub-panel connectors 225A-D may be exposed. The sub-panel connectors 225A-D may be configured with a safety feature to prevent any inadvertent accidents that may occur to the sub-panel connectors 225A-D being exposed and when power continues to flow through. For example, the sub-panel connectors 225A-D may be configured to receive a safety device that is manually inserted (e.g., an insulated material). In another example, the sub-panel connectors 225A-D may include a retractable safety feature that is biased toward a safety position (e.g., via a spring force) when the plug of the main panel connector 130C is not received in the socket of one of the sub-panel connectors 225A-D. While the plug of the main panel connector 130C is being received in the socket of one of the sub-panel connectors 225A-D, the retractable safety feature may be retracted toward an open position and remain in the open position so long as the plug remains in the socket.

As illustrated in FIG. 5 and according to the exemplary embodiments, the sub-floor frame 300 may include posts 305, post platforms 310, and cross beams 315. As the sub-floor frame 300 is configured to hold any weight that is placed atop the sub-floor frame 300 including any server racks as well as the main panels 100 and the sub-panels 200, the posts 305, the post platforms 310, and the cross beams 315 may be manufactured with any material that is capable of maintaining a structural integrity under duress of such weight (e.g., any of a variety of metals).

The post 305 may be a column or pillar that extends from the sub-floor to a predetermined height. Thus, the post 305 may extend perpendicular to a plane of the sub-floor and a plane of the floor. A first end of the post 305 may be anchored such that the post 305 remains stationary. For example, the post 305 may be anchored in the sub-floor such that the post 305 extends a certain distance under the sub-floor to prevent any movement of the post 305 in any direction. Those skilled in the art will understand the various ways that the post 305 may be provided for its functionality to be achieved which may be utilized by the exemplary embodiments.

The post platform 310 may be at a second, opposite end of the post 305. The post platform 310 may be a surface on which the sub-panel 200 may be positioned. The post 305 and the post platform 310 may be manufactured as a unitary component or may be assembled such that the post platform 310 may be fixedly attached to the post 305. The post platform 310 may also be removable if such a feature may be utilized. According to an exemplary embodiment, the sub-panel 200 may be located right above each post 305 on the post platform 310. The sub-panel 200 may be fixed onto the post platform 310, for example, in advance.

The cross beams 315 may be a removable or fixed bar extending from one post platform 310 to an adjacent post platform 310 where the adjacent post platform 310 is laterally or longitudinally adjacent (e.g., not diagonally adjacent). In this manner, the sub-floor frame 300 may establish the grid or checker pattern in which the floor system may be assembled. The cross beams 315 may provide a support surface on which the main panels 100 may be placed atop. Specifically, the long sides 110A-D of the main panels 100 may be placed on the cross beams 315. In this manner, the sub-panel support surfaces 220A-D and the cross beams 315 may enable the main panels 100 to be properly placed atop the sub-floor frame 300. The cross beams 315 may be removable to allow a section of the sub-floor to be exposed with continuity in areas that adjacently placed ones of the main panels 100 are removed. The cross beams 315 and the removable feature will be more clearly seen in the use cases that will described below. However, it is noted that the inclusion of the cross beams 315 in the sub-floor frame 300 is only exemplary. Those skilled in the art will understand that the sub-floor frame 300 may be configured to omit the cross beams 315 (e.g., the posts 305 and the post platforms 310 along with the sub-panels 200 are sufficient to maintain the main panels 100 in an assembled position).

Figure 6:
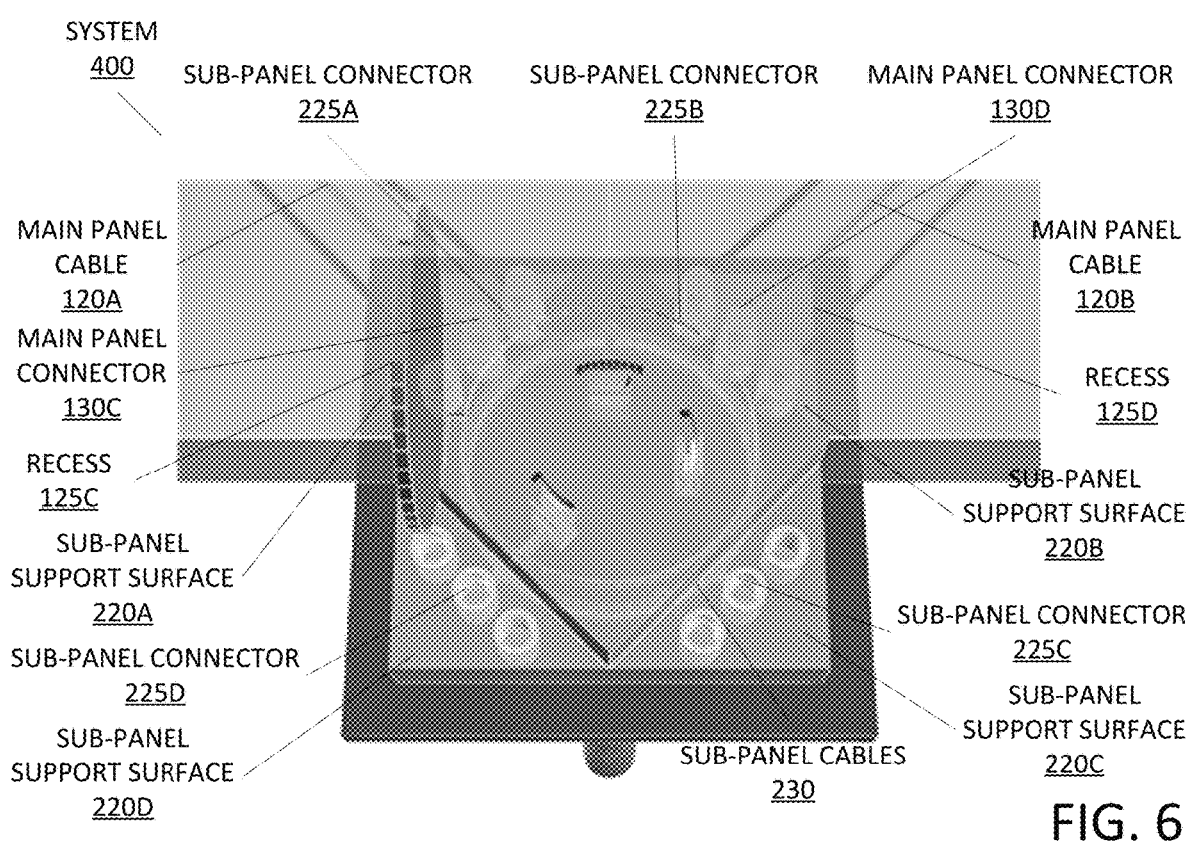
FIG. 6 depicts the exemplary floor system 400 of FIG. 5 shown with a transparency of the exemplary main panel 100 and the sub-panel 200, in accordance with the exemplary embodiments.

FIG. 6 depicts the exemplary floor system 400 of FIG. 5 shown with a transparency of the exemplary main panel 100 and the sub-panel 200, in accordance with the exemplary embodiments. Continuing with the exemplary embodiment in which the tile 105 of the main panel 100 is opaque and the transparency is to illustrate further components of the main panel 100, the main panel cables 120A are visible. On this main panel 100 (e.g., the main panel to the left), the recess 125C and the main panel connector 130C are also shown. As another main panel 100 is also included in FIG. 6 (e.g., the main panel 100 to the right), the main panel cables 120B are also visible. In addition, a recess 125D and a main panel connector 130D are also shown on this main panel 100.

As shown in FIG. 6, the main panel 100 may be placed atop the sub-floor frame 300 and the sub-panel 200. When the main panel 100 is in this assembled position (e.g., as opposed to a removed position), the main panel connector may be coupled with the sub-panel connector (e.g., the main panel connector 130C couples with the sub-panel connector 225A or the main panel connector 130D couples with the sub-panel connector 225B). Thus, power flowing through the main panel cables 120A, 120B may flow through the sub-panel 200. For example, a power source (e.g., a distribution board) may supply power to the server room. Based on the configuration in which the floor system according to the exemplary embodiments are assembled, a first one of the main panels 100 (e.g., the left main panel 100) may receive power from the power source. As shown in FIG. 6, the power may be flowing through the main panel cables 120A. Through the sub-panel 200, the power may also be flowing through the main panel cables 120B of the second one of the main panels 100 (e.g., the right main panel 100). Should the sub-panel outlet 215 receive a power plug, the power flowing through the sub-panel 200 may be transferred to the power plug and to, for example, the server rack.

FIG. 6 also shows the sub-panel 200 with a similar transparency as the main panel 100 for illustrative purposes. As described above, the sub-panel 200 may include sub-panel cables 230. The sub-panel cables 230 may enable the power (e.g., based on the coupling of the main panel connector 130C and the sub-panel connector 225A) to flow to each of the sub-panel connectors 225A-D as well as the sub-panel outlet 215. In an exemplary implementation and as illustrated in FIG. 6, the sub-panel cables 230 may be arranged in a substantially circular configuration where the circle is approximately the size of the sub-panel outlet 215. The sub-panel cables 230 may include three individual cables, one for each cable in the main panel cables 120A, 120B. In the exemplary embodiment where the sub-panel outlet 215 is configured for a three-phase 200V current, the sub-panel outlet 215 may have a socket including three receptacles. Each of the sub-panel cables 230 may be connected to a corresponding one of the receptacles of the sub-panel outlet 215. Furthermore, each of the sockets of the sub-panel connectors 225A-D may be connected to a corresponding one of the sub-panel cables 230 based on how each cable of the main panel cables 120A, 120B are connected to the sub-panel connectors 225A-D.

FIG. 6 also illustrates a manner in which the post 305, the post platform 310, the sub-panel 200, and the main panel 100 may be stacked when the floor system is assembled (e.g., with regard to a specific main panel 100). As shown, the post 305 may extend upward from the sub-floor. The post platform 310 may be positioned at a top end of the post 305. The sub-panel 200 may be positioned atop the post platform 310. The main panels 100 may be positioned atop the sub-panel support surfaces 220A-D of the sub-panel 200. Based on the depths, sizes, and shapes of the various components on this stack, there may be various support interactions that may occur. For example, if a depth of the recesses (e.g., the recess 125C) of the main panel 100 is less than a height of the sub-panel support surfaces 220A-D, the main panel 100 may rest only on the sub-panel 200. In another example, the depth of the recesses (e.g., the recess 125C) of the main panel 100 may extend the same length as the height of the sub-panel support surfaces 220A-D. When the post platform 310 is sized and shaped greater than the sub-panel 200 (e.g., as illustrated in FIGS. 5-6), the main panel 100 may rest on the sub-panel 200 as well as the post platform 310. Those skilled in the art will understand various other stacking options based on the different sizes and shapes of the components. However, the various stacking options may be limited to those that allow for the power connection to be established according to the mechanism described above.

Figure 7:
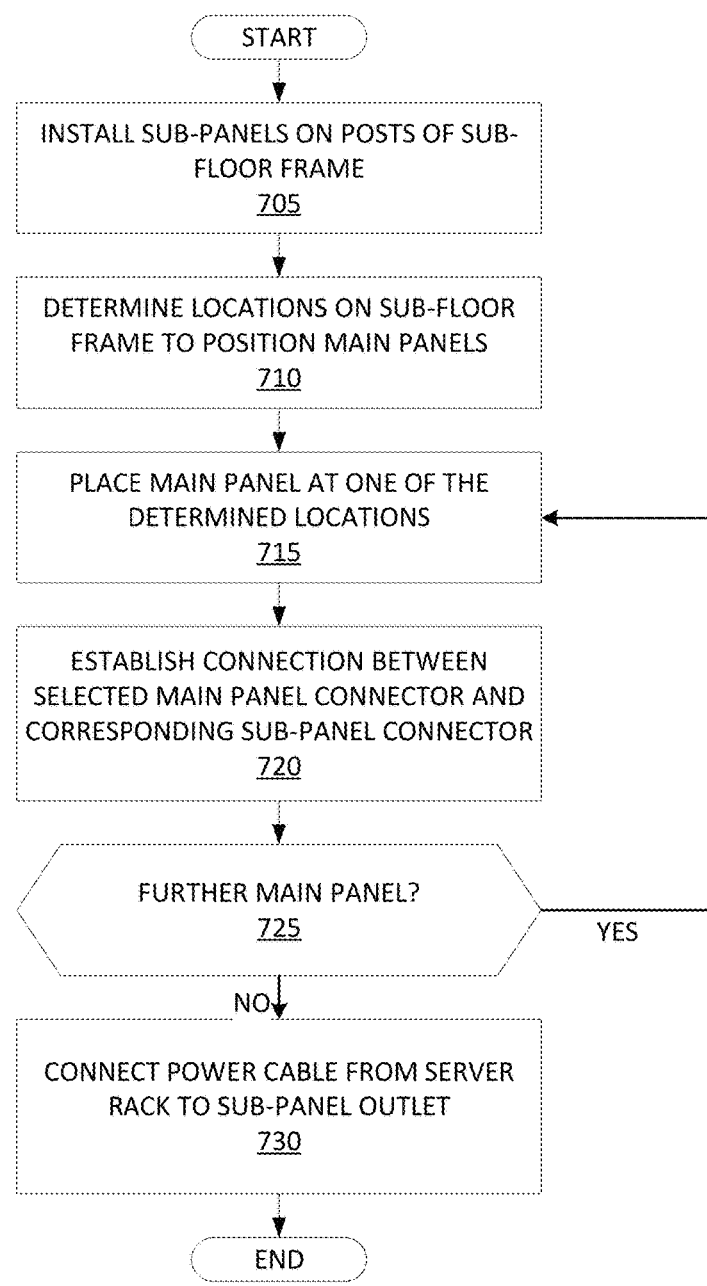
FIG. 7 depicts an exemplary flowchart of a method 700 illustrating the operations to install the exemplary floor system 400, in accordance with the exemplary embodiments.

FIG. 7 depicts an exemplary flowchart of a method 700 illustrating the operations to install the exemplary floor system 400, in accordance with the exemplary embodiments. The method 700 will be described from the perspective of a user who assembles the exemplary floor system 400 such that power is provided to an equipment in positioned in a space where power cables are substantially absent on a top surface of the floor of the floor system 400.

The method 700 relates to a time when certain preparatory steps have already been performed. For example, with regard to the exemplary floor system 400 being installed or assembled in a server room designed to include a sub-floor and a raised floor with removable floor panels, the sub-floor frame 300 may be pre-installed. In another example, a distribution board for power may also be pre-installed at a fixed location in the server room. Thus, the user may be aware of the location of a power source for the server room.

As a further preliminary step, the sub-panels 200 may be installed on the post platforms 310 on the posts 305 of the sub-floor frame 300 (step 705). As described above, the sub-panels 200 may be fixedly attached to the post platforms 310 prior to installation of the main panels 100. The sub-panels 200 may be fixedly attached to the post platforms 310 using a variety of fixation mechanisms. For example, a physical fixation mechanism may fixedly attach the sub-panel 200 to the post platform 310 such as a screw or nail. In another example, an adhesive may be applied to fixedly attach the sub-panel 200 to the post platform 310. In an exemplary embodiment, the sub-panels 200 may be installed on each of the post platforms 310 on the posts 305 of the sub-floor frame 300. However, in another exemplary embodiment, the sub-panels 200 may only be installed on select ones of the post platforms 310 on the posts 305 of the sub-floor frame 300. For example, when an arrangement of the exemplary floor system 400 is pre-planned, the user may select to install the sub-panels 200 at predetermined locations to enable the power flow.

When the exemplary floor system 400 has been prepared to receive main panels 100, the locations of the main panels 100 to be positioned on the sub-floor frame 300 and the sub-panels 200 may be determined (step 710). For example, the user may initially determine where to place the server racks or other network equipment in the server room. The positions of the server racks may define the various pathways in which power may be routed from the distribution board to the location of the server rack in the server room. In another example, the user may determine that the locations of the server racks are yet unknown and may require that the main panels 100 be placed throughout the server room over the entire sub-floor frame 300 for subsequent determinations to be made in modifying use of the main panels 100. In this manner, the user may determine where to install the main panels 100 in the server room to achieve the proper power transfer from the distribution board.

Based on the determined locations, the user may place and install one of the main panels 100 on the sub-floor frame 300 and the sub-panel 200 (step 715). In an exemplary process of installing the main panels 100, the user may begin with one of the main panels 100 that is closest to the distribution board and install subsequent ones of the main panels 100 until the determined locations for the main panels 100 are covered. By installing the main panels 100, the power may be connected from the distribution board and through the main panel 100 and/or the sub-panel 200. Accordingly, the installing of the main panel 100 may establish a power connection between one of the main panel connectors (e.g., the main panel connector 130C) and a corresponding one of the sub-panel connectors (e.g., the sub-panel connectors 225A-D) (step 720).

In installing the main panels 100, the user may determine whether there are one or more further main panels 100 to be installed based on the determined locations that are to have one of the main panels 100 (decision 725). For example, the user may determine whether any of the determined locations on the sub-floor frame 300 is missing the main panel 100 positioned atop. As described above, the sub-floor frame 300 may be configured to provide a grid or checker pattern that creates a plurality of locations. For example, each location may be substantially polygonal (e.g., when viewed from above) that corresponds to the shape of the main panel 100 (e.g., a substantial square shape). These shaped locations may be present throughout an operating floor having an area in which the exemplary floor system 400 according to the exemplary embodiments is installed and/or assembled. It is noted that operating floor area may be configured in any of a variety of shapes. For example, the operating floor area may also be substantially polygonal in shape. In another example, the operating floor area may be substantially polygonal with sections or windows within the area that are not part of the operating floor area. In a further example, the operating floor area may be any shape such as being substantially polygonal with extensions (e.g., L-shaped extensions, arms, etc.). Exemplary implementations of the types of operating floor areas will be described below in use cases. As a result of at least one further of the main panels 100 to be installed (decision 725, "YES" branch), the user may continue to install further main panels 100 and establish the power connections.

As a result of the main panels 100 being installed at the determined locations with no further main panels 100 left to be installed (decision 725, "NO" branch), the user may now utilize the sub-panel outlets 215 on the sub-panels such that power cables from the server rack being connected to receive power (step 730). With the main panels 100 installed to assemble the exemplary floor system 400, the server racks may be placed at the desired locations on the exemplary floor system 400. In an exemplary implementation, the server racks may be sized and shaped to correspond to a size and shape of the main panels 100. In this manner, the server rack may be placed over one of the main panels 100. For example, a width and depth of a server rack may correspond (e.g., be the same) to the lengths of the long sides 110A-D of the main panels or as if the lengths of the long sides 110A-D intersected. Once the server rack is placed and with the server rack being equipped with a PDU, the server rack may include a power cable with a plug at an end thereof. The plug of the power cable may be received in the sub-panel outlet 215 of any sub-panel that is within range of the power cable. For example, a nearest available sub-panel outlet 215 to the server rack may be selected. With power flowing from the distribution board to each of the sub-panels 200 that have a power route connected via the main panels 100, the server rack may receive power by plugging into the sub-panel outlet 215.

In a particular exemplary implementation, the power pathway or route may be established between the distribution board and the server rack through appropriate power cables and the connections established with the main panels 100 and the sub-panels 200. In the exemplary implementation, there may be a power cable extending from the distribution board that is inserted into the sub-panel outlet 215 of one of the sub-panels 200 that is adjacent to the distribution board. The power cable from the distribution board may be treated as an inlet. There may be a further a power cable extending from the server rack that is inserted into the sub-panel outlet 215 of one of the sub-panels 200 that is adjacent the server rack. The power cable from the server rack may be treated as an outlet. In this manner, a current path from the distribution board to the server rack nay be established.

In establishing the current pathway, the current may flow equally from the distribution board to any of the main panels 100 and the sub-panels 200 such that any rearrangement of the main panels 100 to move or additionally install a server rack is not required. Once the main panels 100 have been installed and a current pathway established, the server racks may be moved to any location and plugged into any of the sub-panel outlets 215. In fact, as will be described in an exemplary use case below, when a minimum essential path for current has been secured by the main panel 100, server operation may remain possible in a state of removing other main panels 100 so long as the current pathway is maintained. For example, with the main panels 100 being removable with inlaid power cables 120A, 120B, a user may perform maintenance or any other task that requires access to the space between the exemplary floor system 400 and the sub-floor. In another exemplary use case, the number of main panels 100 may be minimized. Through an appropriate combination and arrangement of the main panels 100 such that a current pathway is established to a desired location (e.g., where a server rack is to be positioned), other locations on the exemplary floor system 400 may utilize one or more insulation panels. The insulation panels may resemble the main panel 100 only in shape but is insulated on the inside. In this manner, it is possible to constitute, for example, a redundant current path from a redundant distribution board to a redundant PDU in a server rack.

Figure 8:
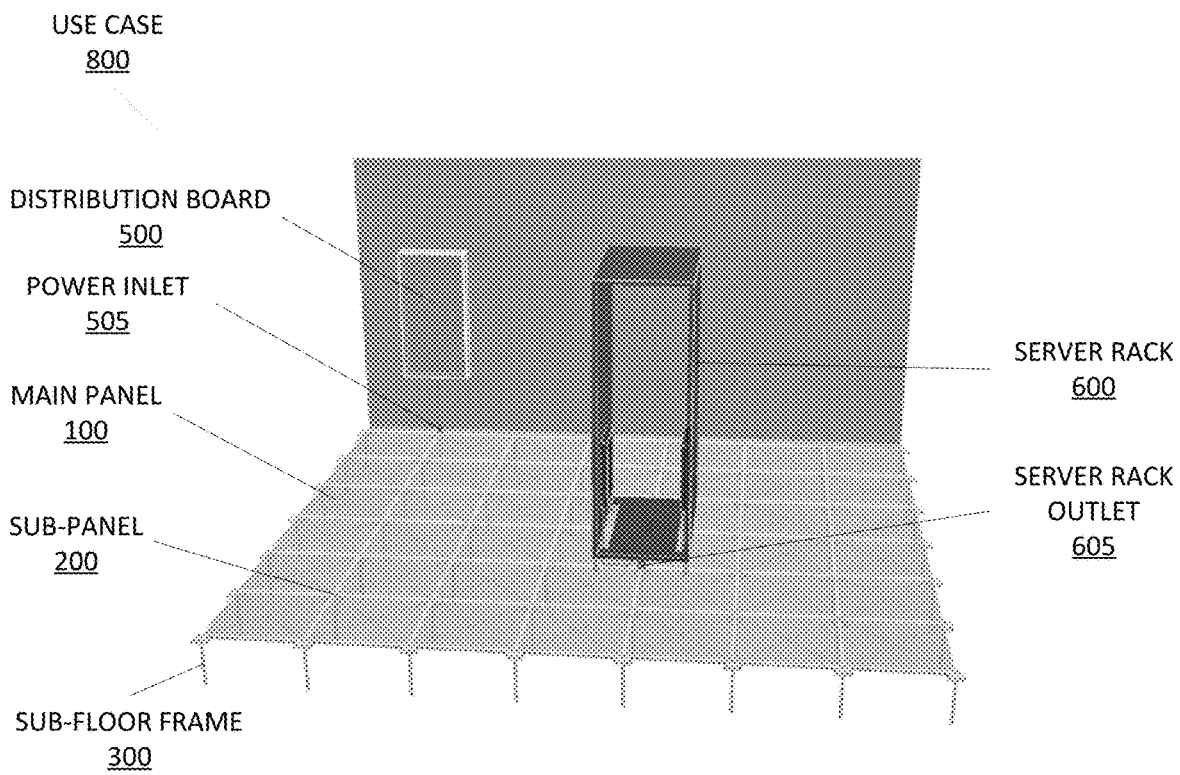
FIG. 8 depicts an exemplary use case 800 of the exemplary floor system 400, in accordance with the exemplary embodiments.

FIG. 8 depicts an exemplary use case 800 of the exemplary floor system 400, in accordance with the exemplary embodiments. The exemplary use case 800 to implement the exemplary floor system 400 may be when there are no conditions for installing and utilizing the features of the exemplary floor system 400. As illustrated, the exemplary use case 800 shows a server room including a plurality of main panels 100, a plurality of sub-panels 200, a sub-floor frame 300, a distribution board 500, a power inlet 505, a server rack 600, and a server rack outlet 605. In the way the exemplary floor system 400 may be installed as described above, the sub-floor frame 300 may provide a grid or checker pattern for the floor of the exemplary floor system 400 to be raised relative to a sub-floor. Accordingly, the posts 305 of the sub-floor frame 300 may extend a predetermined distance based on a relative height that the floor of the exemplary floor system 400 is to be raised. On each of the post platforms 310, there may be sub-panels 200 that are fixedly attached.

In the exemplary use case 800, the main panels 100 may be installed on each location of the sub-floor frame 300 in the server room (e.g., the portion of the server room that is illustrated in FIG. 8). Accordingly, the grid or checker pattern may be entirely filled in by the main panels 100. As noted above, the manner in which to install the main panels 100 may be a design choice or based on current pathways that are to be established. So that power is flowing through the main panels 100, the sub-panels 200, and the sub-panel outlets 215, the distribution board 500 may be the power source for the server room. The distribution board 500 may also include a power cable acting as the power inlet 505 for the exemplary floor system 400 installed in the server room. Accordingly, the power cable may plug into the sub-panel outlet 215 that is closest to the distribution board 500. However, it is noted that the use of the closest/nearest sub-panel outlet 215 is only illustrative and any sub-panel outlet 215 that is within range may be used. With the power inlet 505 in place, the current or power may flow from the distribution board and to each of the main panels 100 and sub-panels 200 in which a current pathway is available.

In the exemplary use case 800, there is also shown only a single server rack 600. However, as will be described in further use cases below, there may be a plurality of server racks 600. The server rack 600 is placed in a substantially central location of the server room or at least the portion of the server room that is shown in FIG. 8. As described above, the server rack 600 may be placed directly on one of the main panels 100, particularly when the server rack 600 has cross-sectional dimensions (e.g., a width and depth) that correspond to the dimensions of the main panels 100 (e.g., the length of the long sides 110A-D). That is, the server rack 600 may be placed to only occupy the area of a selected main panel 100. In another exemplary placement and as illustrated in the exemplary use case 800, the server rack 600 may be positioned over a plurality of main panels 100 (e.g., straddling a boundary between two adjacent main panels 100). In placing the server rack 600 in such a position (e.g., between two locations of the sub-floor frame 300), a power cable of the server rack 600 acting as the server rack outlet 605 may plug into a nearest/closest sub-panel outlet 215 such as either of the sub-panel outlets 215 at the ends of the boundary between the two adjacent main panels 100. With current flowing from the distribution board 500 through the power inlet 505 that powers the exemplary floor system 400 and each sub-panel outlet 215 for which a current pathway is available such as the sub-panel outlet 215 that the server rack outlet 605 is received, the server rack 600 may be powered and any network equipment housed in the server rack 600 and plugged into a PDU of the server rack 600 may receive power.

Figure 9:
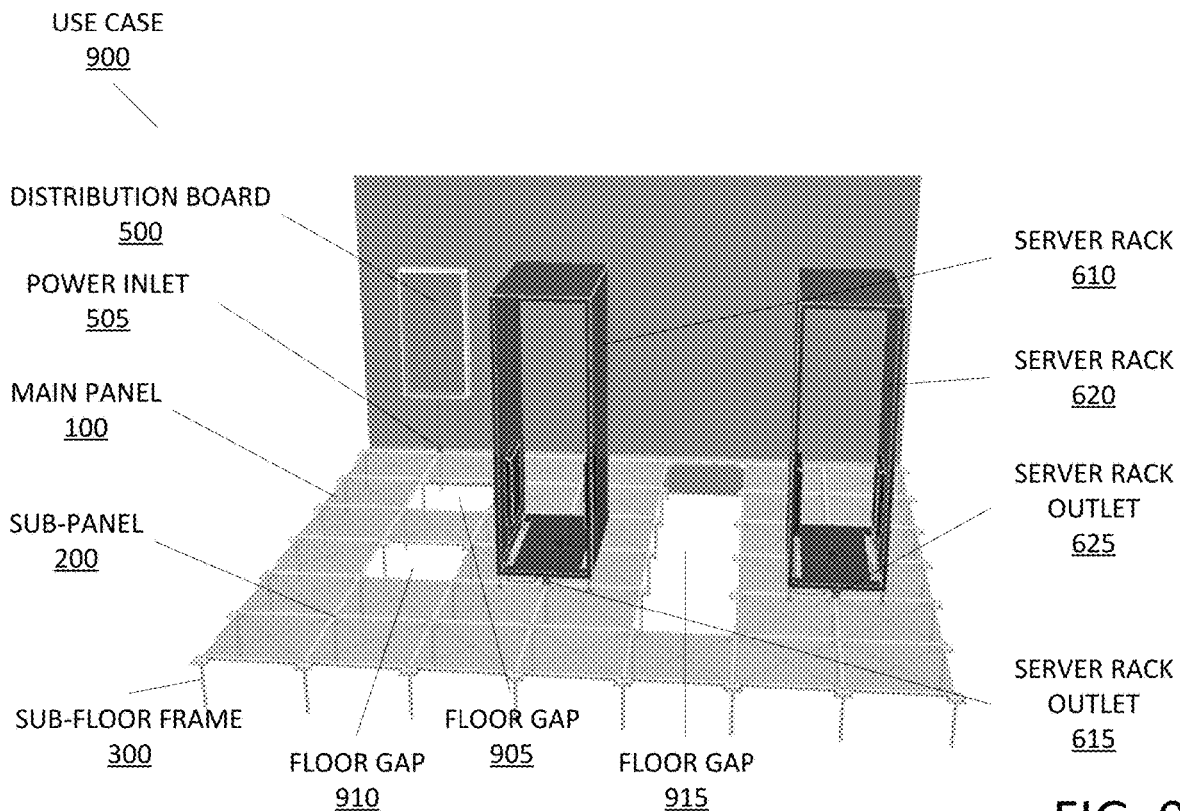
FIG. 9 depicts another exemplary use case 900 of the exemplary floor system 400, in accordance with the exemplary embodiments.

FIG. 9 depicts another exemplary use case 900 of the exemplary floor system 400, in accordance with the exemplary embodiments. The exemplary use case 900 to implement the exemplary floor system 400 may be substantially similar to the use case 800. For example, the exemplary use case 800 and the exemplary use case 900 may be directed to the same server room. However, there may have been changes made such as an upgrade to the system. In fact, the exemplary use case 900 may relate to a time when the server room is being upgraded. In another example, the exemplary use case 900 may relate to a time when maintenance is being performed or access to the space between the floor of the exemplary floor system 400 and the sub-floor is required. In a manner substantially similar to the exemplary use case 800, the exemplary use case 900 shows a server room including a plurality of main panels 100, a plurality of sub-panels 200, a sub-floor frame 300, a distribution board 500, a power inlet 505, a first server rack 610, and a first server rack outlet 615. In upgrading the system, the exemplary use case 900 also includes a second server rack 620 and a second server rack outlet 625. In running the appropriate cables, the space between the floor of the exemplary floor system 400 and the sub-floor may be accessed by removing select ones of the main panels 100. Accordingly, gaps in the floor may be created such as gaps 905, 910, and 915.

In the exemplary use case 900, the first server rack 610 may be placed on the floor of the exemplary floor system 400 in a position closer to the distribution board 500 while the second server rack 620 may be placed on the floor of the exemplary floor system 400 in a position further from the distribution board 500. The first server rack 610 and the second server rack 620 may each be placed like the serve rack 600 over a plurality of main panels 100 (e.g., straddling a boundary between two adjacent main panels 100). In placing the first server rack 610 and the second server rack 620 in such a position (e.g., between two locations of the sub-floor frame 300), a power cable of the first server rack 610 acting as the first server rack outlet 615 and a power cable of the second server rack 620 acting as the second server rack outlet 625 may plug into a nearest/closest sub-panel outlet 215 such as either of the sub-panel outlets 215 at the ends of the boundary between the two adjacent main panels 100. With current flowing from the distribution board 500 through the power inlet 505 that powers the exemplary floor system 400 and each sub-panel outlet 215 for which a current pathway is available such as the sub-panel outlet 215 that the server rack outlet 605 is received, the first server rack 610 and the second server rack 620 may both be powered and any network equipment housed therein and plugged into a respective PDU may receive power.

With regard to the exemplary use case 900 in which a plurality of main panels 100 have been removed, the removal of the main panels 100 may be determined so that the current pathways remain intact for each of the main panels 100 that remain installed and subsequently, each of the sub-panels 200 that have established a connection to the main panels 100 that remain installed. As illustrated, there may be a column of main panels 100 (e.g., represented as vertical stacks in the two-dimensional view of FIG. 8) between the first server rack 610 and the second server rack 620 where neither the first server rack 610 and the second server rack 620 is placed atop any of the main panels 100 in the column. The main panels 100 in this column may be removed to create the gap 915. However, to maintain a current pathway, at least one of the main panels 100 in the column may remain installed. In this manner, a first area to the left of the column may be powered and a second area to the right of the column may also be powered. The removal of the main panels to create the gaps 905, 910 may also maintain a current pathway as there is at least one further main panel 100 that remains installed in the column that the gaps 905, 910 are present. Those skilled in the art will recognize that the gaps 905, 910, 915 may provide access to the space between the floor of the exemplary floor system 400 and the sub-floor so that maintenance, upgrades, etc. may be performed appropriately.

Figure 10:
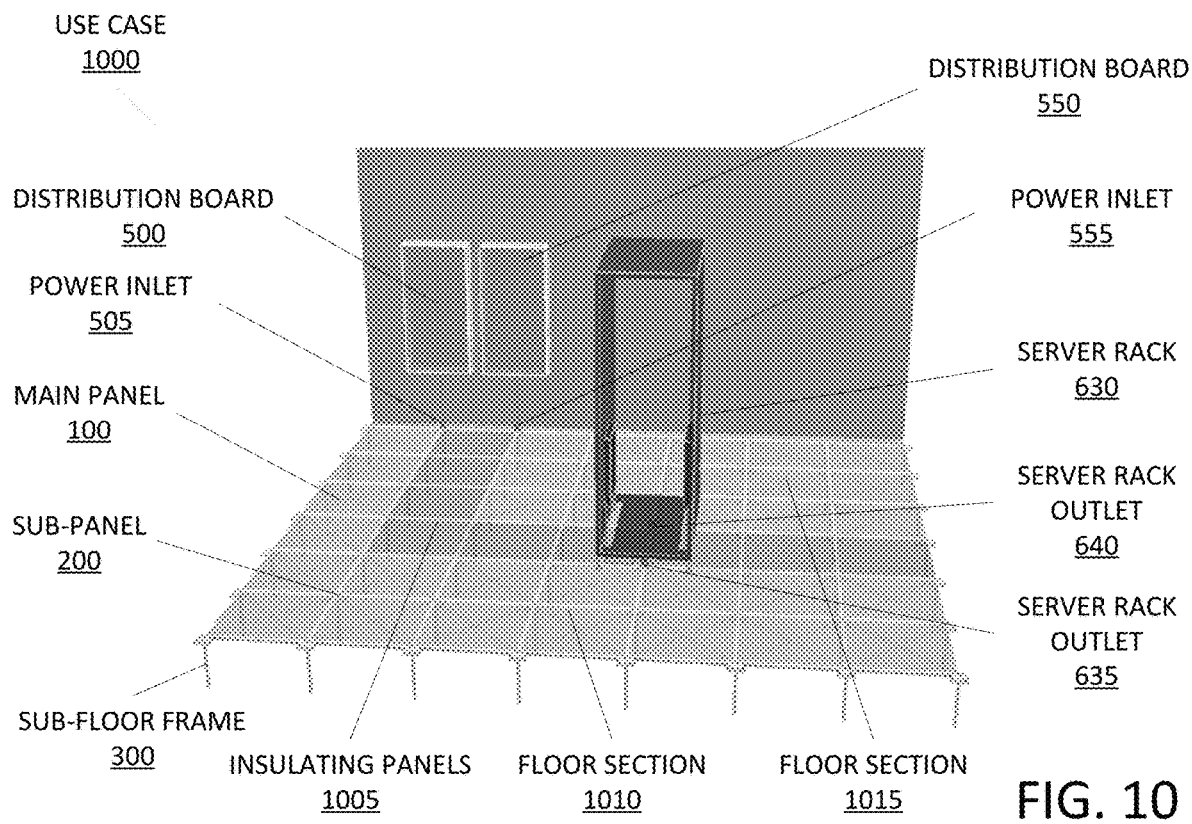
FIG. 10 depicts a further exemplary use case 1000 of the exemplary floor system 400, in accordance with the exemplary embodiments.
Figure 11:
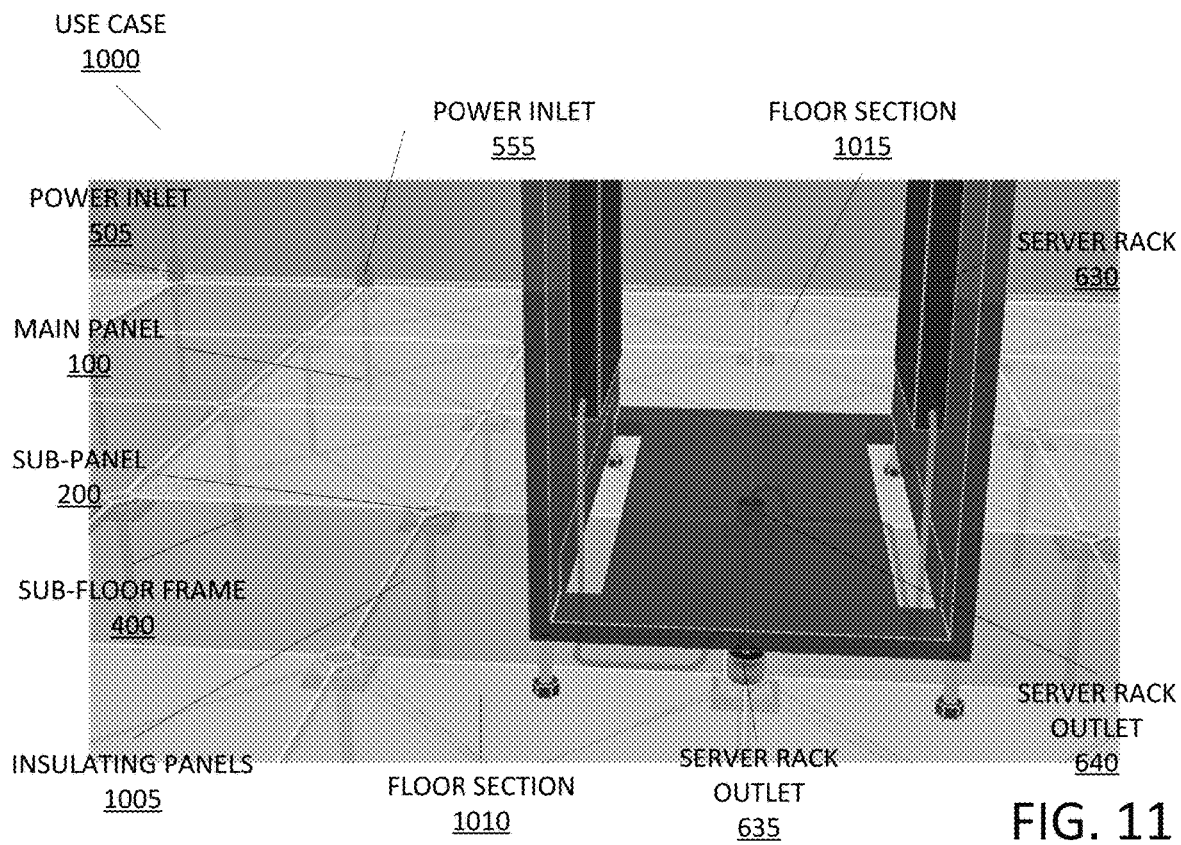
FIG. 11 depicts a zoomed perspective of the further exemplary user case 1000 of the exemplary floor system 400, in accordance with the exemplary embodiments.

FIG. 10 depicts a further exemplary use case 1000 of the exemplary floor system 400, in accordance with the exemplary embodiments. FIG. 11 depicts a zoomed perspective of the further exemplary user case 1000 of the exemplary floor system 400, in accordance with the exemplary embodiments. The exemplary use case 1000 to implement the exemplary floor system 400 may be substantially similar to the use cases 800, 900. For example, the exemplary use cases 800, 900, 1000 may be directed to the same server room. However, the configuration of the exemplary use case 1000 may entail several further features that will be described below. In a manner substantially similar to the exemplary use cases 800, 900, the exemplary use case 1000 shows a server room including a plurality of main panels 100, a plurality of sub-panels 200, a sub-floor frame 300, a distribution board 500, a power inlet 505, a server rack 630, and a server rack outlet 635. The exemplary use case 1000 also includes a further distribution board 550 and a further power inlet 555. Additionally, the server rack 630 includes a further server rack outlet 640. In a variation of the exemplary use cases 800, 900, the exemplary use case 1000 may relate to a configuration of the floor of the exemplary floor system 400 utilizing insulating panels 1005 that replace select ones of the main panels 100. In this manner, the insulating panels 1005 may create two "zones" in the floor of the exemplary floor system 400 such as a floor section 1010 and a floor section 1015 that are electrically separate from one another via the insulating panels 1005. It is noted that the floor of the exemplary floor system 400 may utilize further insulating panels 1005 in a manner similar to the gaps 905, 910 in which a single one of the main panels 100 is replaced with one of the insulating panels 1005 without creating electrically separate zones.

In the exemplary use case 1000, the server rack 630 may be placed on the floor of the exemplary floor system 400 over the insulating panels 1005. The insulating panels 1005 may be installed such that the floor section 1010 is electrically isolated from the floor section 1015. For example, the insulating panels 1005 may be aligned to form a substantial L-shape. In this manner, with the server room being a rectangular shape, the floor section 1010 also exhibits a substantial L-shape and the floor section 1015 exhibits a rectangular shape. With none of the main panels 100 being installed to connect the floor section 1010 to the floor section 1015, the electrical isolation between the floor sections 1010, 1015 may be established. So that the floor section 1010 and the floor section 1015 are both powered, the sever room may utilize a set of distribution boards 500, 550. Specifically, the distribution board 500 may power the floor section 1010 via the power inlet 505 and the distribution board 550 may power the floor section 1015 via the power inlet 555. Thus, any component requiring power that is placed on the floor of the exemplary floor system 400 in the floor section 1010 having access to only sub-panel outlets 215 of the floor section 1010 may be powered through such sub-panel outlets 215. Any component requiring power that is placed on the floor of the exemplary floor system 400 in the floor section 1015 having access to only sub-panel outlets 215 of the floor section 1015 may be powered through such sub-panel outlets 215. Any component requiring power that is placed on the floor of the exemplary floor system 400 having access to sub-panel outlets 215 available on both the floor section 1010 and the floor section 1015 may be provided a power redundant configuration in which power may be received from the distribution board 500 and/or the distribution board 550. Those skilled in the art will understand the usefulness of power redundant configurations. For example, a server rack that provides essential operations may require permanent powering. Thus, a failure of the distribution board 500 may not create a failure of the server rack as the distribution board 550 is also available.

As illustrated, the server rack 630 may be placed over the insulating panels 1005 such that the server rack 630 has access to the sub-panel outlets 215 on both the floor section 1010 and the floor section 1015. The server rack 630 may be configured to utilize the redundant power configuration of the server room illustrated in FIGS. 10-11. For example, the server rack 630 may include two PDUs where a first PDU utilizes the server rack outlet 635 and the second PDU utilizes the server rack outlet 640. The server rack outlet 635 may be plugged into a sub-panel outlet 215 of the floor section 1010 so that power is provided via the distribution board 500. The server rack outlet 640 may be plugged into a sub-panel outlet 215 of the floor section 1015 so that power is provided via the distribution board 550. In another example, the server rack 630 may include a PDU with a redundant power supply configuration utilizing both the server rack outlet 635 and the server rack outlet 640. The server rack outlet 635 may be a primary power outlet such that the server rack outlet 640 serves as a backup power outlet. When the server rack outlet 635 is detected to not have power being received (e.g., failure of the distribution board 500), the server rack outlet 640 may be utilized to receive power (e.g., from the distribution board 550).

The exemplary embodiments provide a floor system including removable floor panels that provide access to a space beneath the floor of the floor system. The floor panels may be main panels with inlaid power cables and power connectors. The floor system may also include sub-panels having inlaid power cables and power connectors where the power connectors of the main panels and the sub-panels couple to one another. When a power supply is connected to the floor system, a current pathway may be established through the main panels and the sub-panels such that a unit connecting to the floor system such as through a sub-panel outlet may be provided power. In this manner, the floor system according to the exemplary embodiments provide the benefits of removable floor panels and floor panels with inlaid cables without the accompanying drawbacks associated with conventional approaches.

It will be apparent to those skilled in the art that various modifications may be made in the present invention, without departing from the spirit or scope of the invention. Thus, it is intended that the present invention cover modifications and variations of this invention provided they come within the scope of the appended claims and their equivalent.

The invention claimed is:

1. A floor system for a server room, the floor system comprising:
   a semi-transparent main panel including main panel inlaid cables and main panel connectors, the main panel inlaid cables connecting a first set of the main panel connectors to a second set of the main panel connectors; and
   a sub-panel including sub-panel inlaid cables and sub-panel connectors, the sub-panel inlaid cables connecting the sub-panel connectors to one another,
   an insulating panel having an identical shape and size as the semi-transparent main panel
   wherein the floor system provides an operating floor via the semi-transparent main panel, the insulating panel, and the sub-panel, the operating floor being raised relative to a sub-floor, the main panel and the insulating panel being a removable floor panels to access a space between the operating floor and the sub-floor,
   wherein the main panel inlaid cables and the sub-panel inlaid cables establish a current pathway from a power source, and wherein the insulating panel terminates the established current pathway of an adjacent semi-transparent main panel.

2. The floor system of claim 1, wherein the sub-panel further includes a sub-panel outlet configured to receive a plug from a server rack located in the server room, the sub-panel outlet powering the server rack via the current pathway.

3. The floor system of claim 1, wherein the main panel connectors are disposed on an underside of the main panel.

4. The floor system of claim 3, wherein the main panel connectors are plugs extending downward from the underside of the main panel.

5. The floor system of claim 4, wherein the main panel connectors are located at a corner of the main panel.

6. The floor system of claim 4, wherein the sub-panel connectors are sockets extending upward toward a top surface of the sub-panel, the sockets configured to receive the plugs.

7. The floor system of claim 1, wherein the main panel and the sub-panel are formed into a point symmetrical shape when viewed from a respective center point.

8. The floor system of claim 1, wherein the main panel and the sub-panel create a flush surface of the operating floor.

9. The floor system of claim 1, wherein the main panel inlaid cables, the main panel connectors, the sub-panel inlaid cables, and the sub-panel connectors are configured for a three-phase 200V current.

10. The floor system of claim 1, wherein the power source is a distribution board of the server room.

11. A server room floor system, the server room floor system comprising:
    a sub-floor frame positioned on a sub-floor, the sub-floor being beneath an operating floor of the server room floor system, the sub-floor frame including posts for the operating floor to be raised a distance from the sub-floor; and
    the operating floor comprising a first set of main panels, a second set of main panels, a set of insulating panels, and sub-panels, individual main panels of the first and second sets of main panels each include main panel inlaid cables and main panel connectors, the main panel inlaid cables connecting a first set of the main panel connectors to a second set of the main panel connectors, the insulating panels being arranged between and electrically insulating the first set of main panels from the second set of main panels, the sub-panels each including sub-panel inlaid cables and sub-panel connectors, the sub-panel inlaid cables connecting the sub-panel connectors to one another,
    wherein the first and second sets of main panels and the insulating panels are removable to access a space between the operating floor and the sub-floor,
    wherein the main panel inlaid cables and the sub-panel inlaid cables establish a current pathway across the server room floor system from a power source.

12. The server room floor system of claim 11, wherein the sub-panels are fixedly attached to a raised end of the posts of the sub-floor frame.

13. The server room floor system of claim 11, wherein the sub-floor frame defines locations on which the main panel is configured to be installed.

14. The server room floor system of claim 11, wherein the first and second sets of main panels and the sub-panels are formed into a point symmetrical shape when viewed from a respective center point.

* * * * *